(12) United States Patent
Moore et al.

(10) Patent No.: US 7,949,974 B1
(45) Date of Patent: May 24, 2011

(54) ISOLATION VERIFICATION WITHIN INTEGRATED CIRCUITS

(75) Inventors: Jason J. Moore, Albuquerque, NM (US); Ian L. McEwen, Golden, CO (US); Reto Stamm, Sunnyvale, CA (US); John Damian Corbett, Santa Clara, CA (US); Eric M. Shiflet, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 548 days.

(21) Appl. No.: 12/038,837

(22) Filed: Feb. 28, 2008

(51) Int. Cl.
*G06F 17/50* (2006.01)
(52) U.S. Cl. ........................ 716/111; 716/116
(58) Field of Classification Search .............. 716/5, 111, 716/116
See application file for complete search history.

(56) References Cited

U.S. PATENT DOCUMENTS

| | | | |
|---|---|---|---|
| 6,624,654 B1 | 9/2003 | Trimberger | |
| 7,444,274 B1 * | 10/2008 | Chopra et al. | 703/13 |
| 7,571,414 B2 * | 8/2009 | Huang et al. | 716/17 |
| 2004/0060025 A1 * | 3/2004 | Kirschbaum | 716/8 |
| 2010/0125739 A1 * | 5/2010 | Creary et al. | 713/189 |

OTHER PUBLICATIONS

McLean et al., "FPGA-Based Single Chip Cryptographic Solution", SDR Technical Conference and Product Exposition, Nov. 13-17, 2006.*
Jason Moore, "Developing Secure Designs Using Virtex-4 FPGAs"; XAPP984; Application Note; (v1.0); Apr. 5, 2007; available from www.Xilinx.com; pp. 1-22.

* cited by examiner

*Primary Examiner* — Jack Chiang
*Assistant Examiner* — Brandon W Bowers
(74) *Attorney, Agent, or Firm* — Kevin T. Cuenot

(57) ABSTRACT

A computer-implemented method of verifying isolation between a plurality of modules of a circuit design to be implemented within an integrated circuit can include identifying a first module and at least a second module of the circuit design for the integrated circuit. One or more circuit attributes indicative of isolation between the first module and the second module can be identified and compared with at least one isolation criterion. An indication of whether the first module is isolated from the second module can be output according to results of the comparison.

10 Claims, 5 Drawing Sheets

ISOLATION VERIFICATION WITHIN INTEGRATED CIRCUITS

FIELD OF THE INVENTION

The embodiments disclosed herein relate to integrated circuit devices (ICs). More particularly, the embodiments relate to ensuring isolation between modules of an IC.

BACKGROUND

Programmable logic devices (PLDs) are a well-known type of integrated circuit (IC) that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). In general, a PIP refers to a circuit component or mechanism that programmably connects or isolates two routing elements, e.g., wires or nodes, of a circuit within a PLD. The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some circuit applications require that system components be isolated from one another. Within some military applications, for example, circuit designs must conform to a standard referred to as Multiple Independent Levels of Security (MILS). One aspect of MILS is the partitioning of a system so that the failure or corruption of any single partition will not corrupt any other partition of the system or cause such other partition(s) to fail.

In other cases, systems are designed with fault tolerance in mind. In such cases, the system is built with a degree of redundancy. A cryptographic application, for example, may utilize duplicate encryptors. The results from each duplicate portion of the circuit can be compared to guard against faults, whether accidental or malicious in nature. In such cases, the duplicate circuit structures should be isolated from one another to ensure that each portion of the circuit provides a result that is independent of the other.

In another example, consider a communication system having two different communication channels, each requiring a different level of security. Conventional approaches for implementing a system would be to use one IC to process the first communication channel and a second IC to process the second communication channel. Isolation is achieved through the use of two different ICs. When systems utilize cryptographic solutions, typically the protected portions of the circuit design are implemented using one IC, while unprotected portions of the circuit design are implemented using an entirely different IC.

In each case, more than one IC is used to achieve isolation despite the capability of the device to house more than one partition of the system. This approach minimizes the possibility that a failure of some sort, whether induced by a malicious attack or not, will expose sensitive data from within the IC and compromise security.

SUMMARY

The embodiments disclosed herein relate to ensuring that one or more portions of a circuit design to be implemented within an integrated circuit (IC) are isolated from one another. One embodiment of the present invention can include a computer-implemented method of verifying isolation between a plurality of modules of a circuit design to be implemented within an IC. The method can include identifying a first module and at least a second module of the circuit design for the IC. One or more circuit attributes indicative of isolation between the first module and the second module can be identified. The circuit attribute(s) can be compared with one or more isolation criteria. An indication whether the first module and the second module are isolated from one another, according to results of the comparison, can be output.

Identifying at least one circuit attribute can include determining costs for paths beginning from nodes located within the first module of the circuit design. The first and second modules can be designated as isolated modules. Paths that include a node of the second module and that have a cost less than a threshold cost can be identified.

Identifying a circuit attribute also can include identifying a channel including non-isolated circuit elements separating the first module and the second module and determining whether a number of component failures that must occur to create an isolation failure across the channel exceeds a threshold number of component failures. Identifying a circuit attribute also can include identifying a channel including a selected type of circuit element that is non-isolated and that separates the first module and the second module.

Identifying a circuit attribute further can include determining whether any package pin of the first module is within a predetermined distance of a package pin of the second module, determining whether any input/output (I/O) buffer of the first module is within a predetermined distance of an I/O buffer of the second module, and/or determining whether any I/O bank includes an I/O buffer of the first module and an I/O buffer of the second module.

Identifying a circuit attribute also can include determining whether a selected circuit element is located less than a predetermined distance from a boundary of the first isolated module and/or the second isolated module.

Another embodiment of the present invention can include a computer-implemented method of verifying isolation between a plurality of modules of a circuit design to be implemented within an IC. The method can include selecting a first module of the circuit design and selecting a second module of the circuit design. The first module and the second module are to be isolated from one another. The method can include calculating costs for paths beginning from nodes located within the first module of the circuit design and determining whether any paths that include a node of the second module have a cost less than a threshold cost. In general, a "cost" refers to a number of failures required for information to leak from one isolated module to another isolated module. An indication of whether the first module and the second module are isolated from one another, according to results of the determination, can be output.

In one embodiment, calculating costs can include assigning costs according to a number of circuit components that must fail to communicatively link two nodes.

The computer-implemented method can include determining whether a channel including a selected circuit element that is unused and disposed between the first module and the second module exists. The method also can include determining whether any package pin associated with the first module is within a predetermined distance of a package pin associated with the second module, determining whether any I/O buffer associated with the first module is within a predetermined distance of an I/O buffer of the second module, and/or determining whether any I/O buffer associated with the first module is located in an I/O bank comprising an I/O buffer associated with the second module.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein. However, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed herein relate to ensuring that portions of a circuit are isolated from one another when located on a same integrated circuit (IC). In general, "isolation" refers to the prevention of information from passing from one isolated module to another in any way that is not explicitly allowed or specified within a circuit design. In the context of cryptographic applications implemented within an IC, for example, one portion of the circuit design that is to handle encrypted data may need to be isolated from an area of the circuit design that is to handle non-encrypted data. In another example, two portions of a circuit design having different security levels may need to be isolated from one another and/or other portions of the circuit design.

Isolation between different portions of the circuit design can be analyzed with respect to selected attributes of the circuit design with an understanding of the underlying physical circuit structures of the IC (the "target device") within which the circuit is to be implemented. These attributes can include, for example, circuit routing, package pins (pins), input/output (I/O) buffers, I/O banks, or the like. Such attributes, to be described herein in greater detail, can be identified from a review of the programmatic description of the circuit design at any of a variety of stages throughout the design process. By comparing attributes of the circuit design with various isolation criteria, verification that the portions of the circuit design designated as isolated are sufficiently isolated from one another can be provided.

Figure 1:
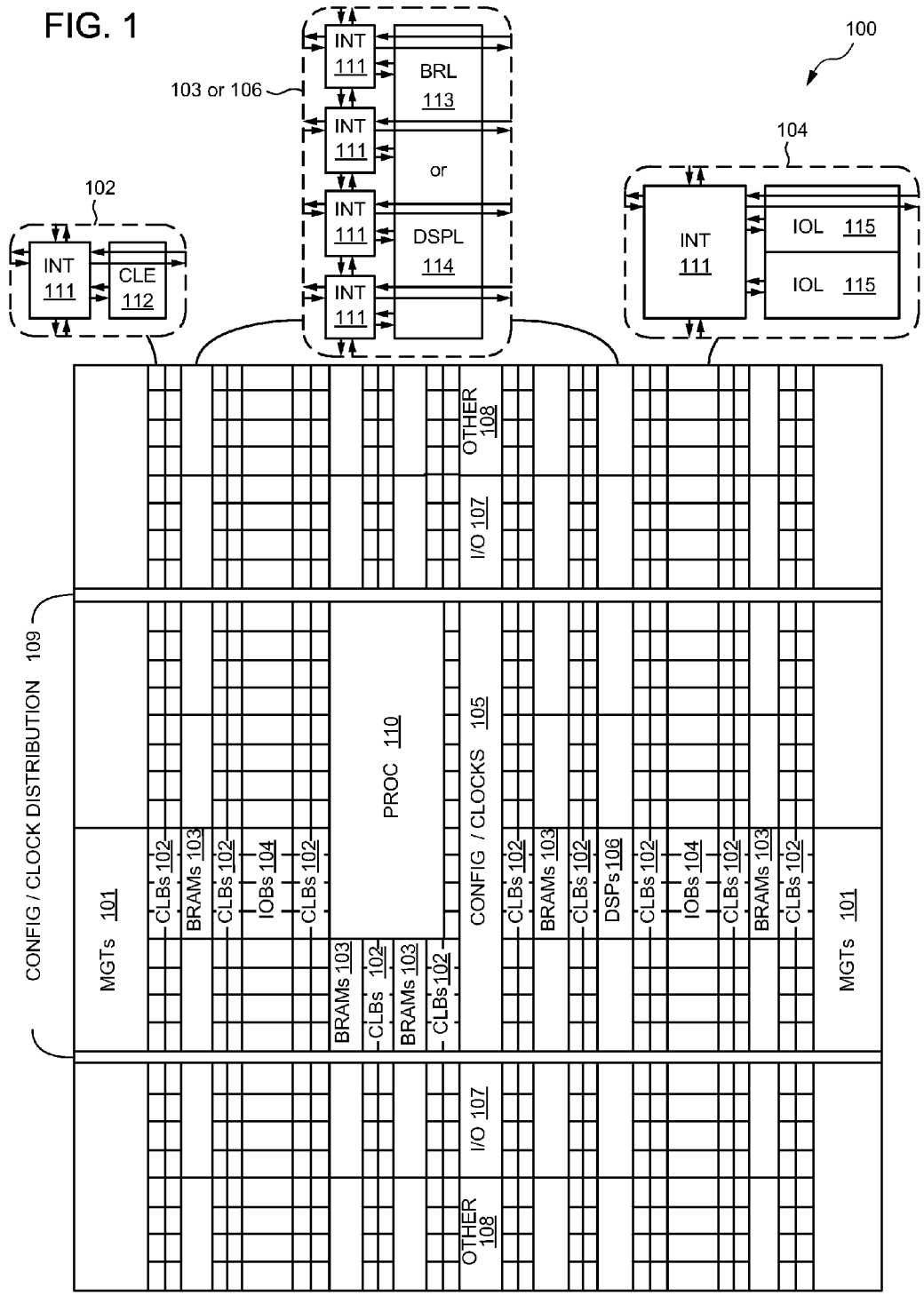
FIG. 1 is a block diagram of an exemplary field programmable gate array type of integrated circuit (IC).

FIG. 1 is a block diagram of an exemplary field programmable gate array (FPGA) type of IC. As noted, advanced FPGAs can include several different types of programmable logic blocks in the array. For example, FIG. 1 illustrates an FPGA architecture 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL) 114 in addition to an appropriate number of programmable interconnect elements.

An IOB 104 can include, for example, two instances of an I/O logic element (IOL) 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115. The IOB 104 also can include an I/O buffer (not shown).

In the pictured embodiment, a columnar area near the center of the die is used for configuration and/or clocks 105, and other control logic 108. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

It should be appreciated that other types of ICs may be utilized with the embodiments disclosed. Such devices can include, for example, complex programmable logic devices (CLPDs), programmable logic arrays (PLAs), and programmable array logic (PAL) devices, application specific integrated circuits (ASICs), or any type of IC, whether programmable or not, in which two or more modules are to be isolated from one another.

Figure 2:
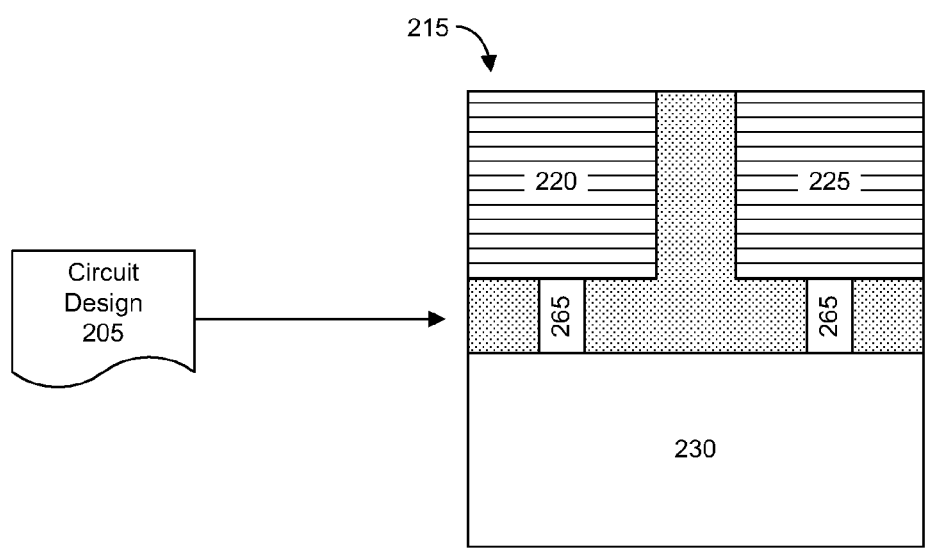
FIG. 2 is a block diagram illustrating an IC having a plurality of isolated regions in accordance with one embodiment of the present invention.

FIG. 2 is a block diagram illustrating an IC 215 having a plurality of isolated regions in accordance with one embodiment of the present invention. IC 215 can be any of a variety of different types of IC, as discussed. As pictured, a circuit design 205 can specify a circuit to be implemented within IC 215. The circuit design 205 can be a programmatic description of the circuit design. For example, the circuit design 205 can be specified as a hardware description language (HDL) file or files, as a netlist, a directed acyclic graph, or the like.

In one embodiment, the circuit design 205 can specify complete placement and routing information for a circuit. In another embodiment, the circuit design 205 may not include complete placement and/or routing information. The circuit design 205 may be a more abstract representation of the circuit to be implemented, e.g., one at a preliminary stage where placement and routing information have not yet been specified or determined. For example, the circuit design 205 may specify one or more user design constraints for the circuit to be implemented. The user design constraints can specify information such as module size and placement on the target device, e.g., IC 215, pin placement, and the like.

In the case of a PLD, the circuit design 205 can be converted into a bitstream that, when loaded into the PLD, configures the PLD to implement the circuit design. As is known, a bitstream can specify connectivity within IC 215 in terms of which processing elements are included, or linked into, the circuit, the configuration of each processing element, and the like. Accordingly, the circuit design 205 also may specify unused circuit elements. As used herein, an "unused" circuit element refers to a physical circuit element on IC 215 that is not communicatively linked, whether electrically, optically, magnetically, etc., with the circuit implemented on IC 215.

Circuit design 205 can include one or more modules that are to be implemented within IC 215 and which may be isolated. Modules that are to be isolated can be annotated as such within circuit design 205. For example, each module to be isolated can include a parameter designating the module as an "isolated module." Since circuit design 205 may be hierarchical in nature, the designation of a portion of the circuit design 205 as being isolated may be done at any desired level within the hierarchy. The isolation parameter will apply to each portion of the circuit design 205, e.g., networks, I/O pins, I/O buffers, or other circuit elements, below the level at which the isolation parameter is inserted within the hierarchy.

Accordingly, an "isolated module," as used herein, can refer to a collection of pins and networks, e.g., circuit elements, that, in general, may only communicate internally, e.g., with other circuit elements of the same module, without restriction. Communication with other modules or circuit elements external to the isolated module may only take place through explicitly defined structures, such as bus macros. A bus macro can refer to a software construct that can be included within a circuit design that causes a predefined sub-circuit to be implemented. The predefined sub-circuit can include a specific arrangement of blocks and routing resources that has been shown to make a safe connection. In other words, "isolation" refers largely to the prevention of information from passing from one isolated module to another in any way that is not explicitly allowed or specified within circuit design 205, e.g., whether electrically, optically, magnetically, etc.

For example, circuit design 205 can specify an isolated module, including pins and networks, that is implemented within region 220, an isolated module that is implemented within region 225, and another isolated module that is implemented within region 230. Each of regions 220, 225, and 230 can be self-contained and isolated from the others. For example, each circuit element of the isolated module within region 220 can be located within region 220. The circuit elements of each respective isolated module are not distributed throughout IC 215 in an effort to efficiently utilize circuit resources or influence timing.

As noted above, a module may be isolated and still communicate with one or more other modules if explicitly allowed or intended to do so. In this regard, various exemptions can be observed that, if present in the circuit design 205, will not influence the determination of whether a module is isolated. Exempted circuit structures, e.g., circuitry, can be identified within the circuit design 205 and tagged or otherwise marked. Further, exempted circuit structures are not considered "isolated" circuit structures. That is, circuit structures marked as "exempt," as well as circuit elements not belonging to an isolated module can be referred to as "non-isolated." One exemption can include circuitry for IC 215 that has been determined to carry negligible information content. Such circuitry can include, for example, clock networks, power lines, and ground lines. Panic alarm resets and other global system resources may fall into this category and be exempt as well. Any resources designated as exceptions or exempt will be ignored when determining whether a module is isolated.

Another exemption pertains to explicit communication channels that are placed in IC 215 to allow isolated modules to communicate with one another. Circuitry that falls into this category, called shared circuitry, also may be ignored when determining whether a module is isolated. Shared circuit structures 265, for example, are used to communicatively link region 220 with region 230 and region 225 with region 230. Circuit structures 265 can be specified directly within circuit design 205. Without such connectivity, circuit design 205 would not function properly or as intended. Such circuitry may be ignored when determining whether regions 220, 225, and 230 are isolated.

Continuing with FIG. 2, regions 220 and 225 are shown with horizontal lines, indicating that both regions are dedicated to processing encrypted data. Each of regions 220 and 225 can be said to be a "black region" processing "black data." For example, region 225 may be a redundant copy of region 220. In another example, region 220 may be rated at one security level, while regions 225 and/or 230 are rated at different security levels. Region 230 can be a region of the circuit that handles non-encrypted data. In that regard, region 230 can be said to be a "red region" handling "red data". In any case, each of the regions 220, 225, and 230, as well as the corresponding isolated module within each respective region, is to be isolated from each other region.

The examples provided above are for purposes of illustration only. It should be appreciated that the embodiments disclosed herein can be applied to any portions of a circuit design to be implemented within an IC that are to be isolated from one another for one reason or another. In any case, using conventional system design techniques, each of regions 220, 225, and 230, and thus each isolated module, would be implemented within a different IC.

In accordance with the embodiments disclosed herein, different attributes of the circuit design 205 can be identified. These attributes can be indicators of whether modules are, or will be, isolated when implemented within IC 215. That is, each of the attributes to be described herein, either taken alone or in combination with one or more other attributes, when found to exist in circuit design 205, can serve as a proxy for modules being isolated. By ensuring that one or more of these attributes is present within circuit design 205, in various combinations, modules can be implemented within a same IC and still be isolated from one another. A software-based analysis tool executing within a computing system can be configured to identify whether the circuit design 205 specifies the circuit attributes necessary for modules to be considered isolated when located within the same IC.

It should be appreciated that any analysis performed on circuit design 205 is performed upon modules. When a module is found to be isolated, the region of the target device that is instantiated by the module also can be said to be isolated. In this regard, the specification may use the terms "module" and "region" interchangeably from time-to-time when discussing isolation of portions of a circuit design.

Figure 3:
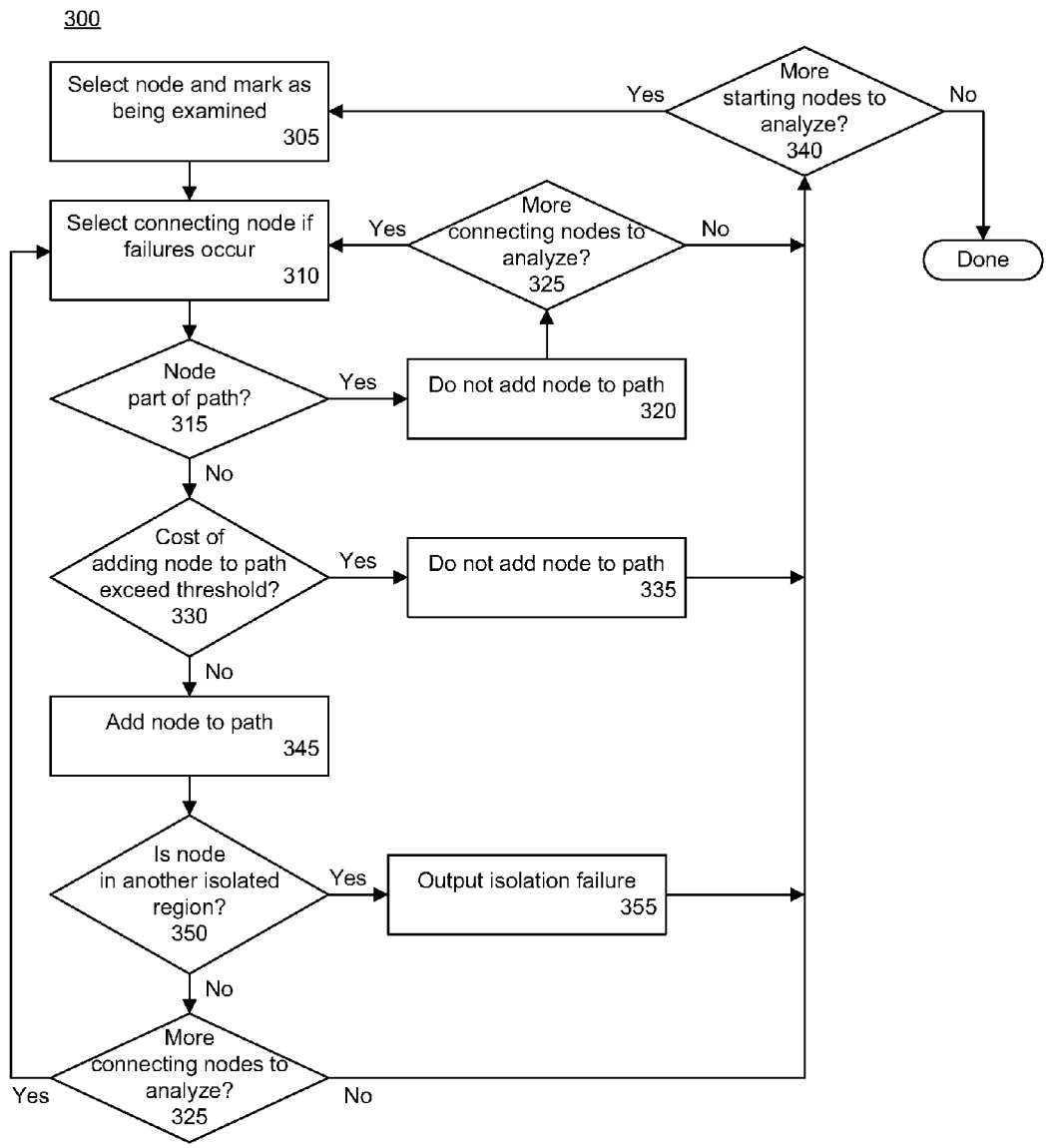
FIG. 3 is a flow chart illustrating a method of determining whether modules of a circuit design are isolated from one another in accordance with another embodiment of the present invention.

FIG. 3 is a flow chart illustrating a method 300 of determining whether modules of a circuit design are isolated from one another in accordance with another embodiment of the present invention. As is known, a circuit design can be represented in the form of a directed acyclic graph, where circuit elements are represented by nodes and connections, e.g., wires, are represented by arcs connecting the nodes. In accordance with the embodiments disclosed herein, the graph can be traversed with reference to the underlying device architecture to ensure that modules that have been designated as isolated are actually isolated.

Method 300 illustrates a simplified example of a depth-limited search of the circuit design. It should be appreciated that this sort of search is but one type of search that can be performed, and that the embodiments disclosed herein are not intended to be limited to any particular type of search strategy. In any case, method 300 can begin in step 305, where a node of the circuit design can be selected as the starting node and marked as being examined. The set of nodes to be explored, and from which the starting node is selected, can include each node that is within an isolated module of the circuit design. In general, each path from every node in an isolated module can be constructed until the path is determined to be isolated or the path is determined not to be isolated, resulting in an isolation fault.

In step 310, a next node, e.g., a connecting node, can be selected that may be connected to the starting node if one or more failures were to occur. A failure can refer to the establishment of a signal pathway that was intended to be blocked. An example of a failure can be a transistor failing and causing a short circuit. In step 315, a determination can be made as to whether the connecting node is already part of the path being constructed from the starting node. If so, the method can continue to step 320, where the connecting node is not added to the current path. The method can loop back to step 325 where a determination is made as to whether there are any further nodes to analyze in terms of forming connections to the starting node. If so, the method can proceed to step 310. If not, the method can proceed to step 340.

Continuing with step 330, where the connecting node is not part of the current path, a determination can be made as to whether the cost of adding the connecting node makes the cost of the current path exceed a threshold. In general, "cost" can refer to a number of failures required for information to leak from one isolated module to another isolated module.

In one embodiment, the cost of establishing a connection between two nodes can be evaluated in terms of the number of circuit elements or components that must fail in order for a connection, e.g., a short circuit, between the two nodes to occur. For example, a connection between two nodes may require one or more PIPs to fail. Each PIP failure would require a particular number of transistor components to fail. The number of transistors that would have to fail in each PIP to form the connection can be the cost of establishing the connection and adding the connecting node to the current path.

In general, the costs can be determined from a fault analysis of the underlying circuitry of the target device. A cost of zero can be indicative of a short circuit between two nodes. The higher the cost of a connection, the less likely the connection is to experience a fault, since the number of underlying components needed to fail increases with the cost. It should be appreciated, however, that costs can be assigned according to any of a variety of different metrics, and the embodiments described herein are not limited to the examples provided. For example, costs can be weighted or lowered. Further, nodes not analyzed in terms of fault tolerance, or those viewed as more or highly susceptible to fault, can be assigned a zero cost for conservative isolation analysis.

The threshold can be a user specified value or other default value that is set high enough to ensure that the number of circuit components needed to fail for the current path to be established is unlikely. Accordingly, when a path being formed exceeds the threshold, it is assumed that the path is sufficiently isolated and that the likelihood of the number of faults needed to occur to form the path, e.g., cause an information leak, is remote.

Once the cost of the path exceeds the threshold, the path need not be explored any further. Accordingly, the method can continue to step 335, where the node is not added to the current path. The method can continue to step 340, where a determination is made as to whether any further nodes remain to be analyzed for connectivity to the starting node.

Continuing with step 345, where the cost of adding the connecting node does not exceed the threshold, the node can be added to the current path. In step 350, a determination can be made as to whether the connecting node is within an isolated module that is different from the isolated module to which the starting node belongs. If so, the current path has traversed outside of the isolated module in which it started and, thus, has resulted in an isolation failure. In other words, the path being traversed has left the initial isolated module and entered another isolated module without having a cost high enough to be considered safe, or unlikely to result in an isolation failure. If the connecting node belongs to a different isolated module from the starting node, the method can proceed to step 355 where the isolation failure can be output. As used herein, "outputting" or "output" can include, for example, writing to a file, generating a report, writing to a user display or other output device, playing audible notifications, sending or transmitting information to another system, exporting, or the like.

The determination of whether the connecting node is within a different isolated module from the isolated module to which the starting node belongs can be implemented in cases where only limited logic may exist outside of an isolated region. With such limitations in place, contact between isolated logic and shared logic will not result in an isolation violation. Accordingly, a path created by component failures is only an isolation violation when that path spans from one isolated region to another while the cost is below the threshold.

If the connecting node does not belong to another isolated module, the method can continue to step 360, where a determination can be made as to whether any further nodes remain to be processed in terms of connecting to the starting node. If so, the method can continue to step 310 and continue processing. If not, the method can proceed to step 340 to determine whether any further nodes remain to be examined as starting nodes for another path to be explored.

In one embodiment, when another starting node is selected, the method can backtrack along the most recent path to locate the first encountered node that has not yet been examined. That node can be selected as the starting node in step 305. Nodes can be searched in varying order. For example, all nodes for one isolated module can be searched prior to moving on to a different isolated module. Alternatively, a node from a different isolated module can be searched without first searching all nodes from a prior, different module. Further, various optimizations may be used to avoid redundantly searching paths and/or nodes.

In another embodiment, the restrictions on the logic that may exist outside of an isolated region may not be so limited. In such cases, a check can be made as to whether the connecting node is not part of the isolated module to which the starting node belongs. In such an embodiment, any failure that allows an isolated signal to leave an isolated region by an unauthorized path may be considered an isolation violation.

Figure 4:
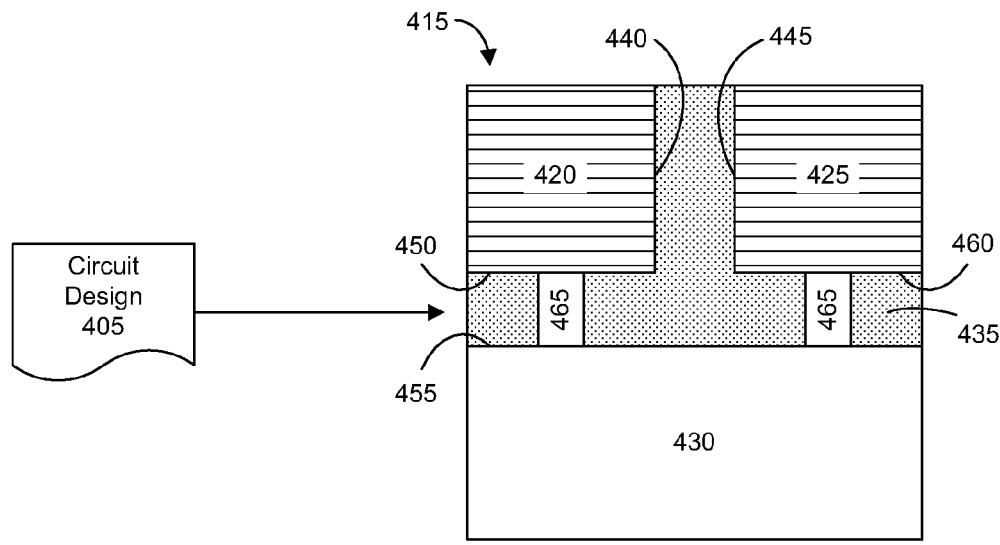
FIG. 4 is a second block diagram illustrating an IC having a plurality of isolated regions in accordance with another embodiment of the present invention.

FIG. 4 is a second block diagram illustrating an IC 415 having a plurality of isolated regions in accordance with another embodiment of the present invention. The IC 415 can be similar to that described with reference to FIG. 2, in that the IC 415 can include isolated regions 420, 425, and 430, as well as shared circuit structures 465. FIG. 4 illustrates a case where a channel 435 can be identified that separates the isolated regions 420, 425, and 430.

As shown, channel 435 can extend, or run, between each of the isolated regions 420, 425, and 430. In one embodiment, particular circuit elements can be analyzed to determine whether such circuit elements offer sufficient isolation. The analysis discussed with reference to FIG. 3, for example, may be applied to circuit elements such as CLBs, BRAMs, other logic cells or tiles, standard cells, or the like. Such circuit structures may include multiple wires and/or connections such that the number of component failures needed for the entire block to fail, e.g., short, exceeds the threshold. Such circuit elements may be identified and used as "bright line rules" to separate isolated regions or modules. That is, once fault analysis for a circuit element is performed, it need not be repeated for like circuit elements. Accordingly, when isolated modules are separated by particular circuit elements that have been analyzed and determined to provide a minimum degree of isolation, the modules can be assumed to be properly isolated.

Accordingly, if the channel 435 includes selected circuit structures identified as providing the required level of isolation, regions 420, 425, and 430 can be considered isolated. It should be appreciated that any circuit elements located in channel 435 also should not be designated as isolated or belonging to an isolated module or region. In one embodiment, circuit elements or circuitry forming channel 435 also can be unused.

In illustration, the portion of channel 435 between boundaries 440 and 445 can be at least one column of non-isolated CLBs, or another circuit element identified as providing the required isolation, in width. Similarly, the width of channel 435 between the lower edge of region 420, denoted as boundary 450, and the top edge of region 430, denoted as boundary 455, can be at least one row of non-isolated CLBs, whether used or unused, in width. A similar situation can be observed with respect to the separation of boundary 460, referring to the lower edge of region 425, and boundary 455.

Placing selected circuit elements between isolated modules, though applicable in cases where placement and routing information are available, is also useful in cases where the circuit design 405 has not yet been placed or routed. Such analysis is useful since routes, e.g., networks, have not yet been specified. Thus, though the circuit design 405 may not specify detailed information, assignment of isolated modules to regions of an IC as specified within user constraints may be evaluated or better planned for future implementation. Accordingly, checking for isolation using bright line rules can aid circuit designers in early stages of system development.

In another embodiment, the channel can be evaluated in terms of the number of component failures that must occur to create an isolation failure across the channel. This number of component failures can be compared with a threshold number of component failures. If the number of component failures needed to cross the channel does not exceed the threshold, then an isolation failure can be reported between the modules.

It should be appreciated that the channel of non-isolated circuitry separating two modules need not be along a straight line. For example, if two modules are not rectangles, but, for example, have one or more diagonal edges, the channel between the two modules can be diagonal rather than vertical or horizontal. Moreover, the channel may be curved in shape or follow another contour. In any case, a channel composed of a selected type of circuit element can be used to separate two or more isolated regions from one another.

Another property that can be checked by the analysis tool is whether particular circuit elements with failure rates exceeding some threshold are used and, if so, where they are used. Isolation criteria may specify that if a circuit element identified as having a failure rate above a threshold is used within the circuit design at a location having a distance less than a predetermined distance from an area of interest, the module is not isolated. For example, carry chains within an IC may be identified as a potential source of isolation failure. The analysis tool can identify cases where a carry chain, though located within a particular isolated module, is located too close to a boundary of that module to ensure isolation. If the carry chain fails, the isolation of the module may be compromised. Conditions such as these can be identified as an isolation fault.

Figure 5:
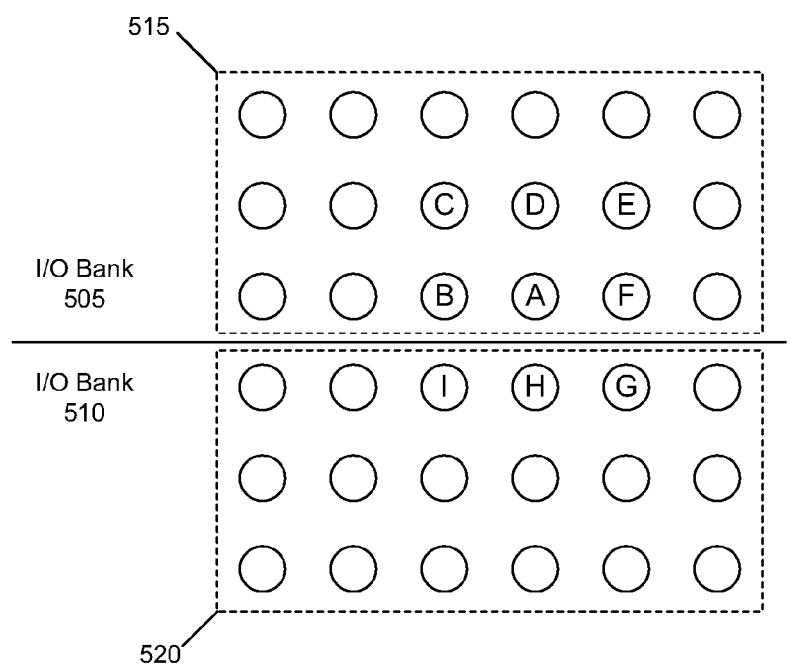
FIG. 5 is a block diagram illustrating input/output (I/O) configurations of an IC in accordance with another embodiment of the present invention.

FIG. 5 is a block diagram illustrating I/O configurations of an IC in accordance with another embodiment of the present invention. FIG. 5 depicts two exemplary I/O banks 505 and 510 of an IC. I/O bank 505 includes a plurality of package pins (pins) 515. I/O bank 510 includes a plurality of pins 520. Each of pins 515 and 520 can be coupled to an I/O buffer (not shown). Those skilled in the art will appreciate that I/O buffers are implemented in silicon and may not have the same configuration or location as the (package) pins coupled to the I/O buffers. For example, an I/O buffer for pin A may not be located next to the I/O buffer for pin F just because the package pins A and F are adjacent to one another.

Other circuit attributes that may be used to determine whether two or more modules are isolated from one another can include proximity of pins and/or I/O buffers to one another and the composition of I/O banks. Each signal of the circuit design can be associated with a particular isolated module to be implemented within the IC, and thus, with a particular region of the IC. Signals of the circuit design can be assigned to particular I/O buffers and corresponding pins 515 and/or 520. In that regard, signals also are assigned to particular I/O banks. For example, any signal assigned to one of pins 515 can be said to be in, or associated with, I/O bank 505. Similarly, any signal of the circuit design assigned to a pin 520 can be said to be in, or associated with, I/O bank 510.

I/O bank composition indicates whether signals from more than one isolated module of the circuit design have been assigned to pins of a same I/O bank. The particular isolated module with which each pin is associated within a given I/O bank can be reviewed to ensure that the I/O bank includes only pins for a single isolated module. With reference to I/O bank 505, for example, the signal assignments to pins can be evaluated to ensure that each of pins 515 is associated with a signal of a same isolated module. Thus, each of pins A, B, C, D, E, F, and the other pins 515 of bank 505 must be associated with signals of a same isolated module of the circuit design to ensure proper isolation. While some pins 515 may be unused, any pins that are used will belong to the same isolated module.

Pin proximity relates to the distance between two pins of different isolated modules. Isolation criteria can specify a minimum distance, e.g., predetermined number of pins, that should separate pins of different isolated modules. For example, if one pin is associated with a first isolated module and an adjacent pin is associated with a second isolated module, the two pins may not be considered sufficiently isolated from one another. Accordingly, the first and second isolated modules also are not sufficiently isolated from one another. Continuing with the example, pin A must belong to the same isolated module as each of adjacent pins B, C, D, E, F, G, H, and I. Otherwise, the isolated module associated with pin A will not be isolated from any other isolated module that may include one of pins B, C, D, E, F, G, H, or I.

While adjacency has been used to illustrate the proximity of pins, it should be appreciated that the specific distance between pins and/or geometry needed with respect to two or more pins to maintain isolation will be dependent upon the architecture of the target IC. For example, it may be the case that isolation can be achieved if a pin of a first isolated module has no adjacent pins to the left or right that belong to a different isolated module. Pins immediately above or below, however, from different isolated modules may be acceptable to maintain isolation. Isolation criteria can specify a distance and a direction in which the minimum distance is to be observed. Different distance/direction combinations can be specified with respect to left, right, up, down, and/or diagonal. Any of a variety of isolation criteria can be applied to the pin placement specified in the circuit design to determine whether modules of the circuit design are sufficiently isolated. Such rules will reflect the physical circuitry of the pins for the target IC.

A similar analysis can be performed with respect to I/O buffers in terms of distance and/or direction. For example, an I/O buffer associated with a first isolated module should not be located adjacent to, or less than a predetermined distance from, an I/O buffer that is associated with a second isolated module, to ensure that the first and second isolated modules are isolated with respect to one another. Distance may be measured in terms of the number of I/O buffers separating two I/O buffers.

The pin and I/O buffer criteria described above address the situation in which an isolation failure within an IC occurs and a red pin, e.g., a pin associated with a signal of a red isolated module, is located adjacent or next to a black pin, e.g., a pin associated with a signal of a black isolated module. In cases where a red pin is located next to a black pin, a failure in the device, whether malicious or not, may cause a loss of isolation between the pins, thereby compromising the security of the IC. The embodiments disclosed herein address this issue by placing an additional barrier between the pins, by ensuring that two pins of different isolated modules are not located proximate to one another or have a particular geometry with respect to one another.

It should be appreciated that pin and I/O buffer proximity and I/O bank composition can be analyzed for a circuit design specifying complete placement and routing information as well as for circuit designs that specify user constraints for pin location.

Figure 6:
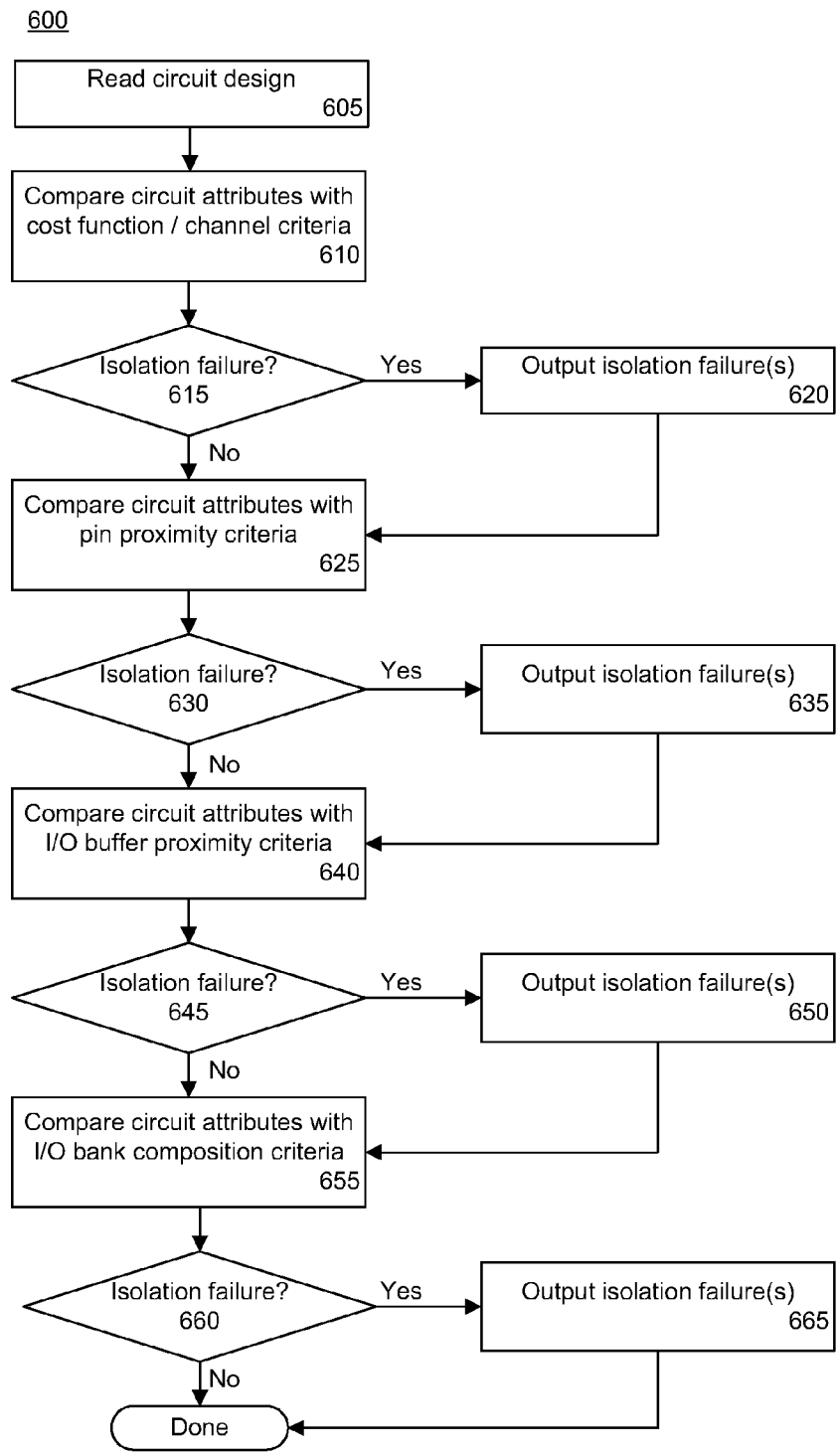
FIG. 6 is a flow chart illustrating a method of validating isolation of a circuit design in accordance with another embodiment of the present invention.

FIG. 6 is a flow chart illustrating a method 600 of validating a circuit design in accordance with another embodiment of the present invention. Method 600 can be performed by a software-based analysis tool executing within a computer system as described herein. Method 600 illustrates an exemplary technique for determining whether two or more modules are, or will be, isolated from one another when implemented within an IC. Method 600 can begin in step 605 where a circuit design can be read. The circuit design can specify two or more isolated modules that can be identified. In one embodiment, the circuit design can specify placement and routing information. In another embodiment, when such information is not fully specified, one or more user constraints specifying module shape and/or placement as well as pin and/or I/O buffer assignments can be read.

In step 610, the analysis tool can identify and compare circuit attributes with isolation criteria, to determine whether isolation fault(s) exist, as determined using a cost function or according to whether a channel separating isolated modules exists. As noted, either type of analysis can be performed when placement and routing information are available. When placement and routing information are not available, the existence of a channel as described herein can be determined. In step 615, a determination can be made as to whether an isolation failure has been detected. If so, the method can continue to step 620, where the isolation failure(s) can be output.

In step 625, circuit attributes can be identified and compared with isolation criteria relating to pin proximity. As noted, pin proximity refers to the location of pins of one isolated module with respect to pins of different isolated modules. The circuit attributes for pin proximity can specify the location to which each pin has been assigned. Accordingly, such circuit attributes can be compared with pin proximity criteria specifying allowable relative locations of pins of different isolated modules with respect to one another. The distance between pins of different isolated modules can be compared with minimum distance and/or direction criteria. In step 630, a determination can be made as to whether an isolation failure has been detected. If so, the method can proceed to step 635 to output the isolation failure(s).

In step 640, circuit attributes can be identified and compared with I/O buffer proximity criteria. As noted, I/O buffer locations can be identified. The circuit attributes, which specify locations of the I/O buffers, can be compared with I/O buffer proximity criteria. In step 645, a determination can be made as to whether an isolation failure has been detected. If so, the method can proceed to step 650 to output the isolation failure(s).

In step 655, circuit attributes can be identified and compared with I/O bank composition criteria. The circuit attributes specifying I/O bank composition can be compared with I/O bank composition criteria specifying that no I/O bank of the IC is to include pins from more than one isolated module. In step 660, a determination can be made as to whether isolation failure(s) have been detected. If so, the method can continue to step 665, where the isolation failure (s) can be reported or output.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figure. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of verifying isolation between a plurality of modules of a circuit design to be implemented within an integrated circuit, the method comprising:
   identifying a first module and a second module of the circuit design for the integrated circuit, wherein the first module and the second module are separated by a plurality of non-isolated circuit elements;
   determining, by a processor, a count corresponding to a number of failures that must occur to create a signal path between the first module and the second module;
   adjusting the count according to a fault susceptibility of a first circuit element that must fail to create the signal path;
   comparing the adjusted count with a threshold number of failures; and
   indicating whether the first module is isolated from the second module according to the comparison.

2. The method of claim 1, wherein adjusting the count further comprises:
   determining a cost of the first circuit element, wherein the cost is used in determining the count and indicates a number of underlying components of the first circuit element that must fail for the circuit element to fail;
   determining a fault susceptibility of the first circuit element; and
   adjusting the cost of the first circuit element according to the fault susceptibility.

3. The method of claim 2, further comprising:
   decreasing the cost when the first circuit element is susceptible to fault.

4. The method of claim 2, further comprising:
   increasing the cost when the first circuit element is not susceptible to fault.

5. The method of claim 1, further comprising:
   determining a location for a second circuit element within the first module;

determining whether a failure rate of the second circuit element exceeds a threshold failure rate; and when the failure rate of the second circuit element exceeds the threshold failure rate and the second circuit element is located within a predetermined distance of a boundary of the first module, indicating that the first module is not isolated.

6. A computer program product, comprising:

a non-transitory computer-usable medium storing computer-usable program code that, when executed, verifies isolation between a plurality of modules of a circuit design to be implemented within an integrated circuit, the computer-usable medium comprising:

computer-usable program code that identifies a first module and a second module of the circuit design for the integrated circuit, wherein the first module and the second module are separated by a plurality of non-isolated circuit elements;

computer-usable program code that determines a count corresponding to a number of failures that must occur to create a signal path between the first module and the second module;

computer-usable program code that adjusts the count according to a fault susceptibility of a first circuit element that must fail to create the signal path;

computer-usable program code that compares the adjusted count with a threshold number of failures; and computer-usable program code that indicates whether the first module is isolated from the second module according to the comparison.

7. The computer program product of claim 6, wherein the computer-usable medium further comprises:

computer-usable program code that determines a cost of the first circuit element, wherein the cost is used in determining the count and indicates a number of underlying components of the first circuit element that must fail for the first circuit element to fail;

computer-usable program code that determines a fault susceptibility of the first circuit element; and computer-usable program code that adjusts the cost of the first circuit element according to the fault susceptibility.

8. The computer program product of claim 7, wherein the computer-usable medium further comprises:

computer-usable program code decreases the cost when the first circuit element is susceptible to fault.

9. The computer program product of claim 7, wherein the computer-usable medium further comprises:

computer-usable program code that increases the cost when the first circuit element is not susceptible to fault.

10. The computer program product of claim 6, wherein the computer-usable medium further comprises:

computer-usable program code that determines a location for a second circuit element within the first module;

computer-usable program code that determines whether a failure rate of the first circuit element exceeds a threshold failure rate; and computer-usable program code that, when the failure rate of the second circuit element exceeds the threshold failure rate and the second circuit element is located within a predetermined distance of a boundary of the first module, indicates that the first module is not isolated.

* * * * *